United States Patent
Nakatani

(10) Patent No.: US 7,804,372 B2
(45) Date of Patent: Sep. 28, 2010

(54) RING OSCILLATOR FOR TEMPERATURE SENSOR, TEMPERATURE SENSOR CIRCUIT, AND SEMICONDUCTOR DEVICE HAVING THE SAME

(75) Inventor: Keigo Nakatani, Kawasaki (JP)

(73) Assignee: Fujitsu Limited, Kawsaki (JP)

( * ) Notice: Subject to any disclaimer, the term of this patent is extended or adjusted under 35 U.S.C. 154(b) by 108 days.

(21) Appl. No.: 12/314,388

(22) Filed: Dec. 9, 2008

(65) Prior Publication Data
US 2009/0096495 A1 Apr. 16, 2009

Related U.S. Application Data

(63) Continuation of application No. PCT/JP2006/311580, filed on Jun. 9, 2006.

(51) Int. Cl.
*H03B 5/24* (2006.01)
(52) U.S. Cl. .................. 331/57; 331/176; 327/142
(58) Field of Classification Search .................. 331/57, 331/176
See application file for complete search history.

(56) References Cited

U.S. PATENT DOCUMENTS 6,731,558 B2 * 5/2004 Yamauchi et al. .......... 365/222
7,078,954 B2 * 7/2006 Watanabe ................... 327/512
7,315,221 B2 * 1/2008 Ha et al. ..................... 331/176
7,400,208 B2 * 7/2008 Yoshikawa ................. 331/176
7,411,436 B2 * 8/2008 Fang et al. .................. 327/262
7,581,881 B2 * 9/2009 Kim et al. ................... 374/170

FOREIGN PATENT DOCUMENTS

| JP | 54-73580 | 6/1979 |
|---|---|---|
| JP | 63-52491 | 10/1988 |
| JP | 2-147828 | 6/1990 |
| JP | 5-175793 | 7/1993 |
| JP | 6-77409 | 3/1994 |
| JP | 2004-134472 | 4/2004 |

OTHER PUBLICATIONS

International Search Report for PCT/JP2006/311580, mailed Aug. 8, 2006.
PCT International Search Report issued Jan. 22, 2009 in corresponding International Application PCT/JP2006/311580.

* cited by examiner

*Primary Examiner*—Joseph Chang
(74) *Attorney, Agent, or Firm*—Staas & Halsey LLP

(57) ABSTRACT

A ring oscillator includes an odd number of unit circuits connected in series each of which includes an inverter. Each of the unit circuits includes the inverter and a MOSFET. The MOSFET is an FET which is a temperature sensor, and uses a drain-source leakage current in a state that the FET is normally turned off.

20 Claims, 8 Drawing Sheets

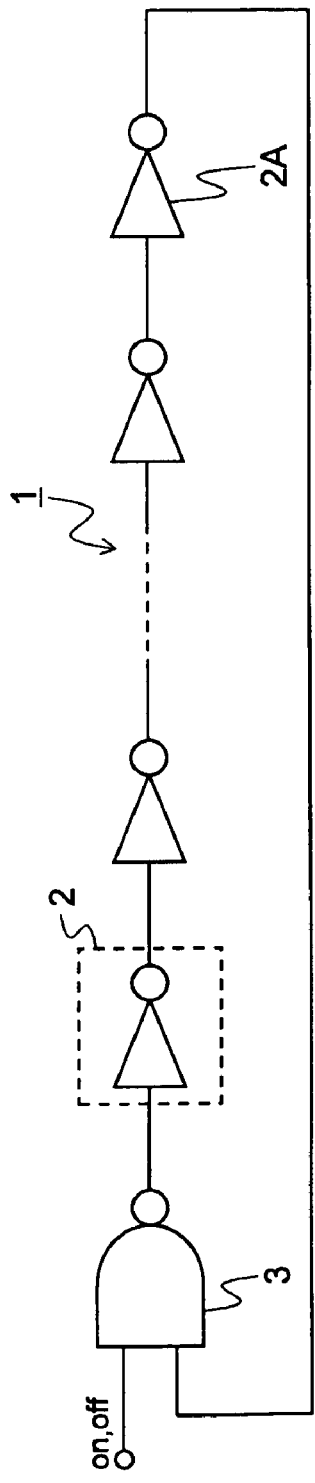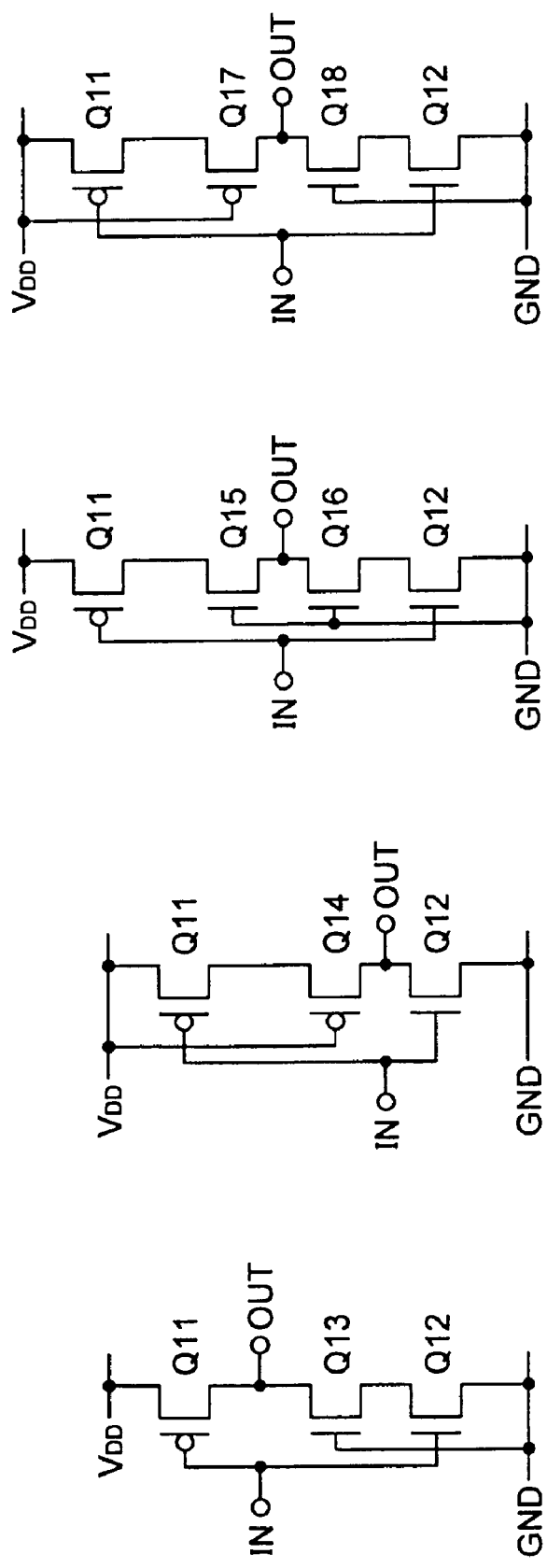

US 7,804,372 B2

RING OSCILLATOR FOR TEMPERATURE SENSOR, TEMPERATURE SENSOR CIRCUIT, AND SEMICONDUCTOR DEVICE HAVING THE SAME

CROSS REFERENCE TO RELATED APPLICATIONS

This is a continuation application of PCT application Ser. No. PCT/JP2006/311580, filed on Jun. 9, 2006.

BACKGROUND OF THE INVENTION

1. Field of the Invention

An embodiment of the present invention relates to a ring oscillator for a temperature sensor, a temperature sensor circuit, and a semiconductor device having the same, which may include a ring oscillator for a temperature sensor which can accurately detect a substrate temperature by using an oscillation frequency that depends greatly on a substrate temperature, a temperature sensor circuit, and a semiconductor device having the same.

2. Description of the Related Art

In a semiconductor device, temperature of its semiconductor substrate (or substrate temperature) is raised by its own operation. The rise in the substrate temperature may cause a malfunction or may eventually invite thermal runaway. Accordingly, the substrate temperature needs to be measured accurately.

For example, it is known that the substrate temperature is measured by using a drain-substrate leakage current of a MISFET (see Japanese Patent Laid-Open No. 54-073580). It is also known that the substrate temperature of a power semiconductor device is measured by using a current flowing in a bipolar transistor (see Japanese Patent Laid-Open No. 6-077409). Further, it is known that the substrate temperature is measured by using a difference of voltage potential in a series circuit including a semiconductor diode and resistor (see Japanese Patent Laid-Open No. 2004-134472).

Incidentally, it is known that an oscillation frequency of a ring oscillator is controlled based on a value of a leakage current at a leakage current generating unit including a pn junction (see Japanese Patent Laid-Open No. 5-175793).

By the above known technique to measure the substrate temperature, it is possible to accurately measure the substrate temperature to certain degree, and to prevent a malfunction and the like of the semiconductor device. However, an increasing of scale integration in a semiconductor device invites an increasing of an amount of heat generated by the semiconductor device. Then, the substrate temperature needs to be measured more accurately. For this reason, it is necessary to measure a factor having a higher dependence on the temperature than that of a current or voltage, which is obtained as a result of the measurement in the well-known technique to measure the substrate temperature.

SUMMARY OF THE INVENTION

One aspect of an object of the present invention is to provide a ring oscillator for a temperature sensor which uses such characteristic that an oscillation frequency depends on a substrate temperature.

One aspect of another object of the present invention is to provide a temperature sensor circuit using a ring oscillator in which an oscillation frequency depends on a substrate temperature.

One aspect of further object of the present invention is to provide a semiconductor device having a temperature sensor circuit using a ring oscillator.

A ring oscillator for a temperature sensor according to one embodiment of the present invention includes an odd number of unit circuits connected in series, and each of the unit circuits comprises an inverter, and one or more FETs (Field Effect Transistors) each of which is a temperature sensor and uses a drain-source leakage current in a state that the FET is normally turned off.

In one embodiment of the present invention, the one or more FETs which are temperature sensors are inserted in series into the inverter.

In one embodiment of the present invention, the one or more FETs which are temperature sensors are connected to an output of the inverter, and form a transfer circuit.

A temperature sensor circuit according to one embodiment of the present invention includes the ring oscillator above described, a frequency-dividing circuit frequency-dividing one of an oscillation output of the ring oscillator and a predetermined clock, a counting circuit counting the other of the oscillation output of the ring oscillator and the predetermined clock in one cycle of an output of the frequency-dividing circuit, a first holding circuit holding an established upper limit value corresponding to an upper limit value of a substrate temperature, a comparing circuit comparing a count output of the counting circuit with the established upper limit value held by the first holding circuit, and outputting a first detection signal when the count output is larger than the the established upper limit value, and a generation circuit generating a stop signal which stops to operate a circuit based on the first detection signal.

A semiconductor device provided with the temperature sensor circuit according to one embodiment of the present invention includes a semiconductor substrate, a plurality of circuit blocks provided on the semiconductor substrate, and at least one temperature sensor circuit provided in each of the plurality of circuit blocks. And, the temperature sensor circuit has a structure described above.

According to the ring oscillator for a temperature sensor of one embodiment of the present invention, the ring oscillator is driven by using the drain-source leakage current (subthreshold leakage current) of the FET, so that it is possible to detect the substrate temperature as the oscillation frequency of the ring oscillator. The leakage current depends on the substrate temperature, and depending level of the leakage current is larger extent than that of the current or voltage used in the known technique to measure the substrate temperature. Accordingly, by detecting the oscillation frequency of the ring oscillator, the substrate temperature can be measured accurately. Thus, even when the scale of integration in a semiconductor device grows, the substrate temperature can be measured more accurately.

According to one embodiment of the present invention, an FET is inserted in series into the inverter which forms the ring oscillator. According to another embodiment of the present invention, an FET is connected to the output of the inverter which forms the ring oscillator, and forms the transfer circuit. Thus, the ring oscillator is driven by the drain-source leakage current of the FET which is connected thereto, so that the substrate temperature can be detected as the oscillation frequency of the ring oscillator.

According to the temperature sensor circuit of one embodiment of the present invention, it is possible to detect the substrate temperature as the oscillation frequency of the ring oscillator. In addition, by frequency-dividing one of the oscillation output of the ring oscillator and the predetermined clock, it is possible to lengthen the cycle of the detected oscillation frequency based on the frequency division ratio, thereby making more accurate measurement of the cycle possible. Thus, the substrate temperature can be measured more accurately.

According to the semiconductor device having the temperature sensor of one embodiment of the present invention, the temperature sensor circuit having the above-described ring oscillator is provided for each of the plurality of circuit blocks. Accordingly, the substrate temperature can be detected as the oscillation frequency of the ring oscillator for each circuit block. Thus, even when the scale of integration in the semiconductor device grows, the substrate temperature can be measured more accurately.

BRIEF DESCRIPTION OF THE DRAWINGS

FIG. 1A-1E is a diagram illustrating a structure of one embodiment of a ring oscillator for a temperature sensor according to the present invention.

DETAILED DESCRIPTION OF THE PREFERRED EMBODIMENTS

Figure 2A:
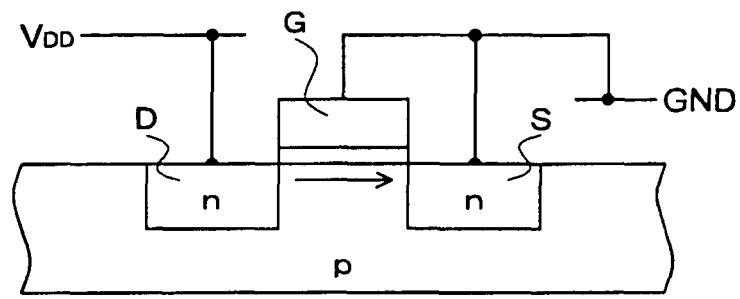
FIG. 2A-2C is a diagram illustrating a structure of one embodiment of a ring oscillator for a temperature sensor according to the present invention.

FIGS. 1 and 2 are diagrams illustrating a structure of an embodiment of a ring oscillator having a function as a temperature sensor according to the present invention. As illustrated in FIG. 1A, a ring oscillator 1 for a temperature sensor includes an even number of inverters connected in series, and single NAND gate 3. As illustrated in FIG. 1B, reference characters Q11 and Q12 designate MOSFETs forming an inverter, and reference character Q13 designates a MOSFET forming the temperature sensor according to the present embodiment (ditto for Q14 to Q24).

The inverter is an inverting circuit which inverts a signal inputted thereto, and forms a unit circuit 2 of the ring oscillator 1. Accordingly, the unit circuit 2 is represented as an inverter in FIG. 1A. The NAND gate 3 may be considered to practically function as an inverter, as described later. Accordingly, the NAND gate 3 forms a unit circuit 2 of the ring oscillator 1, and the ring oscillator 1 includes an odd number of unit circuits 2 (This holds true for FIG. 3A). An output of an inverter 2A in the final stage of the ring oscillator 1 is inputted to the NAND gate 3, which functions as an input-stage inverter. Thus, the ring oscillator 1 is formed which includes the odd number of unit circuits 2 connected in series (and in a form of a ring). Each of the unit circuits 2 includes an inverter, and one or more FETs (MOSFETs Q13 and Q20, for example), each of which functions as a temperature sensor and uses a drain-source leakage current in a state that the FET is normally or always turned off. An output of an inverter 2A, which is a final-stage of the ring oscillator 1, is used as an output of the ring oscillator (ROSC) 1, as illustrated in FIG. 4.

The unit circuit 2 includes a p-channel MOSFET Q11 and n-channel MOSFETs Q12 and Q13, as illustrated in FIG. 1B. That is, the unit circuit 2 is a CMOS circuit. In FIG. 1B, the MOSFET given a circular mark on its gate electrode is the p-channel type, and the MOSFETs not given the circular mark on their gate electrodes are the n-channel type (this holds true for other figures). A series circuit which includes the inverter and the temperature sensor is connected between two power supply lines or between a power supply voltage VDD (3.5 V, for example) and a ground potential GND (0V, for example).

The MOSFETs Q11 and Q12 form an actual inverter circuit. By contrast, a gate electrode G, which is a control electrode, of the MOSFET Q13 is connected to the ground potential GND, so that the MOSFET Q13 is OFF (non-conductive state) normally. Thus, as illustrated by an arrow in FIG. 2A, only a drain-source leakage current (subthreshold leakage current) flows from a drain D to a source S in the MOSFET Q13. Accordingly, the ring oscillator 1 is driven by this leakage current. In the MOSFET Q13, a current which flows from the drain D to a p-type semiconductor substrate (or a well region) when the MOSFET Q13 is turned off does not contribute to driving of the ring oscillator 1.

The MOSFET Q13 is provided to detect of a substrate temperature, and functions as a temperature sensor which is operated by using the drain-source leakage current of the MOSFET. The leakage current has very high dependence on the temperature. The MOSFET Q13 is inserted in series into the inverter (or a series circuit including the MOSFETs Q11 and Q12 which form the inverter). That is, the MOSFET Q13 is inserted into a path in which a driving current of the ring oscillator 1 flows. Accordingly, an oscillation frequency (or cycle) of the ring oscillator 1, which is driven by the drain-source leakage current of the MOSFET Q13, has very high dependence on the temperature.

The MOSFET used as the temperature sensor may be an element in which the drain-source leakage current (subthreshold leakage current) is present, such as an FET (Field Effect Transistor). Accordingly, for example, a MISFET, a MESFET or the like may be used as the temperature sensor.

Figure 2B:
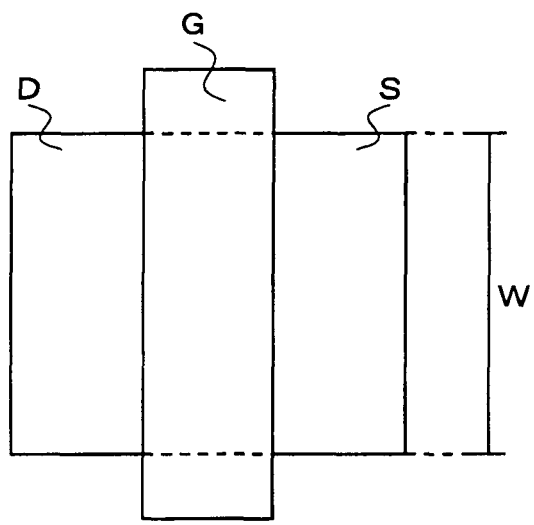

In order to obtain the leakage current of a sufficiently large value, a gate width W of the MOSFET Q13 is made sufficiently large, as illustrated in FIG. 2B. Specifically, the gate width W of the MOSFET Q13, which is a temperature sensor (or not forming the inverter), is made sufficiently larger than (several to dozen or so times as large as, for example) that of the same conductivity type MOSFET Q12 which forms the inverter.

As illustrated in FIG. 1B, the MOSFET Q13, which is the temperature sensor, is provided closer to an output OUT side (at a location near the output OUT) of the inverter than the same conductivity type MOSFET Q12, which forms the inverter. In other words, the MOSFET Q13 is provided farther from the ground potential GND (or power supply line) than the MOSFET Q12. The reason is as follows. Since the gate width W of the MOSFET Q13 is large as described above, a floating capacitance resulted from the gate width W is also large. For this reason, when the MOSFET Q13 is provided closer to the ground potential GND than the MOSFET Q12, the MOSFET Q12 is undesirably turned ON (conductive state) by the large floating capacitance of the MOSFET Q13. As a result, the ring oscillator 1 fails to operate properly, and hence it becomes impossible to detect accurately the substrate temperature based on the oscillation frequency.

Figure 2C:
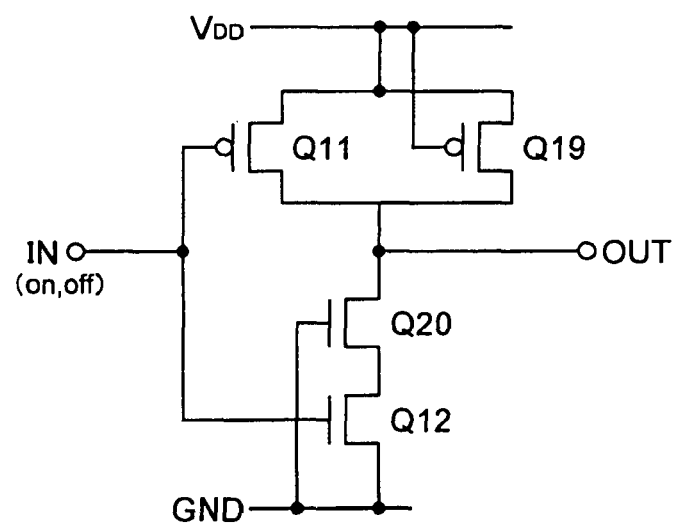

As illustrated in FIG. 2C, the NAND gate 3 is formed of a CMOS circuit. A control signal for the ring oscillator 1 is inputted to the gate electrodes (or input terminal IN) of the MOSFETs Q11 and Q12. When the control signal is ON (of high level), the ring oscillator 1 operates. When the control signal is OFF (of low level), the ring oscillator 1 does not operate. As can be seen from FIG. 2C, the MOSFETs Q11 and Q12 form the inverter practically.

Since a MOSFET Q19 has a gate electrode which is connected to the power supply voltage VDD, the MOSFET Q19 is normally turned off. Since a MOSFET Q20 has a gate electrode of a MOSFET Q20 which is connected to the ground potential GND, the MOSFET Q20 is normally turned off. Thus, only the drain-source leakage current flows in the MOSFETs Q19 and Q20, so that the ring oscillator 1 is driven by the leakage current.

In the ring oscillator 1, the leakage current increases with rise in the substrate temperature, and, as a result of this, an oscillation frequency of the ring oscillator 1 increases. According to my experiment, when the substrate temperature rises by 1° C., for example, the oscillation frequency increases by several percent. The ratio of the increase in the oscillation frequency depends on a fabrication process and a like of a semiconductor device 103, and hence the ratio can be known accurately. Accordingly, by detecting the oscillation frequency of the ring oscillator 1, the substrate temperature can be determined accurately.

The unit circuit 2 may employ various structures other than the structure illustrated in FIG. 1B. That is, the unit circuit 2 includes one or more n-channel or p-channel MOSFETs, which are used as the temperature sensor.

FIG. 1C illustrates an embodiment which uses a p-channel MOSFET Q14 as the temperature sensor, instead of the MOSFET Q13 illustrated in FIG. 1B. A gate electrode of the MOSFET Q14 is connected to the power supply voltage VDD, so that the MOSFET Q14 is normally turned off, as above described. In the MOSFET Q14, the drain-source leakage current flows from its source to its drain, in reverse of the case of FIG. 2A. Then, the drain-source leakage current in the MOSFET Q14, which is turned off, is used in detection of the substrate temperature. As above described, the gate width of the MOSFET Q14 which is the temperature sensor is made sufficiently larger than that of the same conductivity type MOSFET Q11, which forms the inverter. Also, the MOSFET Q14 which is the temperature sensor is desirably provided farther from the power supply voltage VDD (or power supply line) than the same conductivity type MOSFET Q11, which forms the inverter.

FIG. 1D illustrates an embodiment which uses an n-channel MOSFET Q15 in addition to a MOSFET Q16, which corresponds the MOSFET Q13 illustrated in FIG. 1B. Since gate electrodes of the MOSFETs Q15 and Q16 are connected to the ground potential GND, the MOSFETs Q15 and Q16 are normally turned off. Thus, the drain-source leakage currents in the respective MOSFETs Q15 and Q16, which are turned off, are used in detection of the substrate temperature. In addition to the MOSFET Q16 provided on the ground potential GND side, the MOSFET Q15 is provided on the power supply voltage VDD side which is opposed to the ground potential GND side across an output terminal OUT. According to the embodiment, a value of the leakage current can be made double of that obtained by the structure illustrated in FIG. 1B, for example, so that the substrate temperature can be detected more accurately.

In FIG. 1D, both of the n-channel MOSFETs Q15 and Q16 may be replaced with p-channel MOSFETs. In this case, the gate electrodes of these MOSFETs are connected to the power supply voltage VDD.

FIG. 1E illustrates an embodiment which uses a p-channel MOSFET Q17 in addition to a MOSFET Q18 which corresponds to the MOSFET Q13 illustrated in FIG. 1B. Since a gate electrode of the MOSFET Q17 is connected to the power supply voltage VDD, the MOSFET Q17 is normally turned off. Then, the drain-source leakage currents in the respective MOSFETs Q18 and Q17, which are turned off, are used in detection of the substrate temperature. In the embodiment, a value of the leakage current can be made double of that obtained by the structure illustrated in FIG. 1B, for example, so that the substrate temperature can be detected more accurately.

FIG. 3 is a diagram illustrating a structure of another embodiment of a ring oscillator for the temperature sensor according to the present invention. In this embodiment, an FET which is the temperature sensor is connected to the output of the inverter, and forms a transfer circuit 4.

Figure 3A:
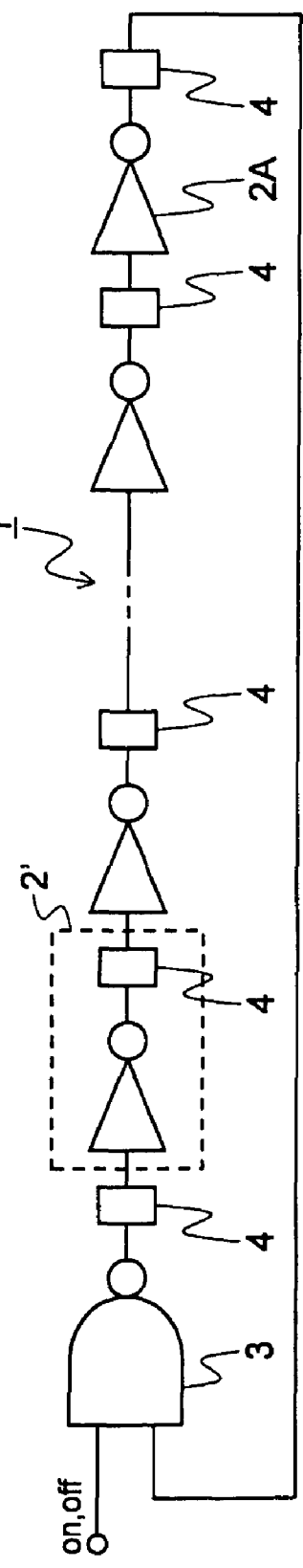
FIG. 3A-3D is a diagram illustrating a structure of another embodiment of a ring oscillator for a temperature sensor according to the present invention.
Figure 4:
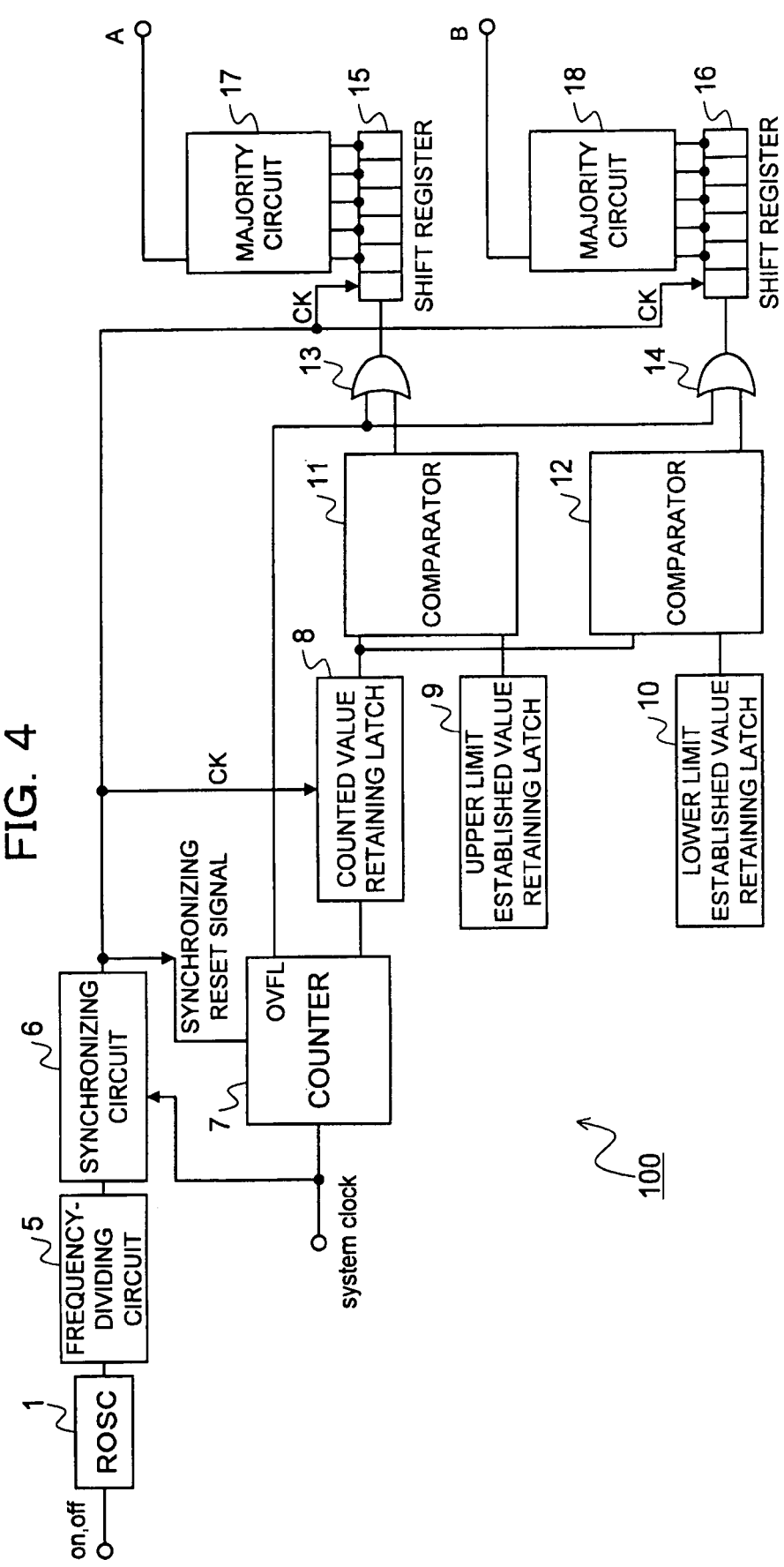
FIGS. 4 and 5 are diagrams illustrating structures of one embodiment of a temperature sensor circuit according to the present invention.

In this embodiment, the unit circuit 2' includes the inverter and the transfer circuit 4, as shown in FIG. 3A. The transfer circuit 4 is connected to the output of the inverter (including the NAND gate 3) which corresponds to the transfer circuit 4. The transfer circuit 4 includes one or more MOSFETs, each of which is used as the temperature sensor using the drain-source leakage current of the FET.

Figure 3D:
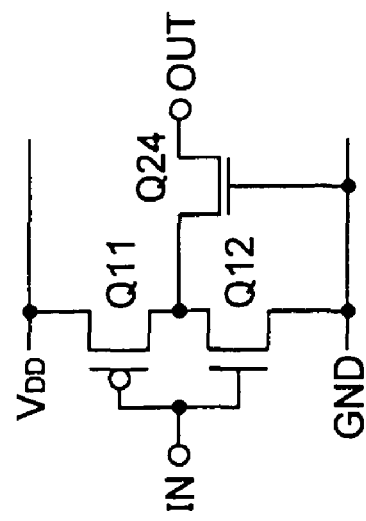
Figure 3C:
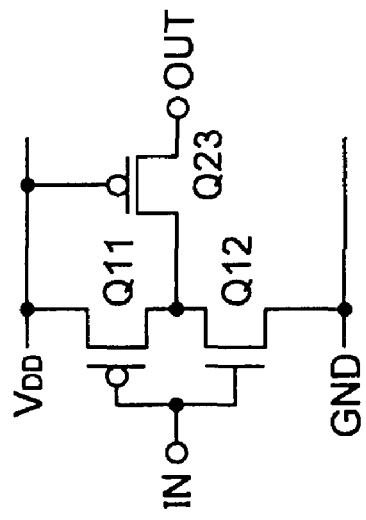
Figure 3B:
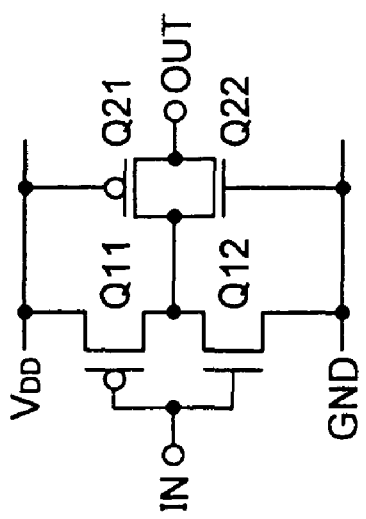

In FIG. 3B, the transfer circuit 4 includes a transfer gate. That is, the transfer circuit 4 includes a parallel circuit which includes a p-channel MOSFET Q21 and an n-channel MOSFET Q22. Since gate electrodes of the MOSFETs Q21 and Q22 are connected to the power supply voltage VDD and the ground potential GND, respectively, these MOSFETs Q21 and Q22 are normally turned off. The MOSFETs Q21 and Q22 each of which is the temperature sensor are connected to the inverter in series. That is, the MOSFETs Q21 and Q22 are connected to the inverter so as to be inserted into a path in which the driving current of the ring oscillator 1 flows. Accordingly, the oscillation frequency (cycle) of the ring oscillator 1, which is driven by the drain-source leakage currents of the MOSFETs Q21 and Q22, has very high dependence on the temperature. Then, the drain-source leakage currents in the respective MOSFETs Q21 and Q22, which are turned off, are used in detection of the substrate temperature. In the embodiment, a value of the leakage current can be made double of that obtained by the structure illustrated in FIG. 1B, for example, so that the substrate temperature can be detected more accurately.

The transfer circuit 4 of the unit circuit 2' may employ various structures other than the structure illustrated in FIG. 3B. In FIG. 3C, the transfer circuit 4 includes single p-channel MOSFET Q23. Since a gate electrode of the MOSFET Q23 is connected to the power supply voltage VDD, the MOSFET Q23 is normally turned off. Thus, the drain-source leakage current in the MOSFET Q23, which is turned off, is used in detection of the substrate temperature.

In FIG. 3D, the transfer circuit 4 includes single n-channel MOSFET Q24. Since a gate electrode of the MOSFET Q24 is connected to the ground potential GND, the MOSFET Q24 is normally turned off. Then, the drain-source leakage current in the MOSFET Q24, which is turned off, is used in detection of the substrate temperature.

According to my study, it is considerable that the substrate temperature is measured by using the dependence on the temperature of wiring resistance between inverters which form the ring oscillator 1. However, according to this structure, it is difficult to obtain an oscillation cycle of the ring oscillator 1 having sufficient dependence on the temperature. In other words, this structure poor sensitivity to the substrate temperature, and hence, it is difficult to avoid that changes of the oscillation cycle becomes unclear by noise.

Figure 5:
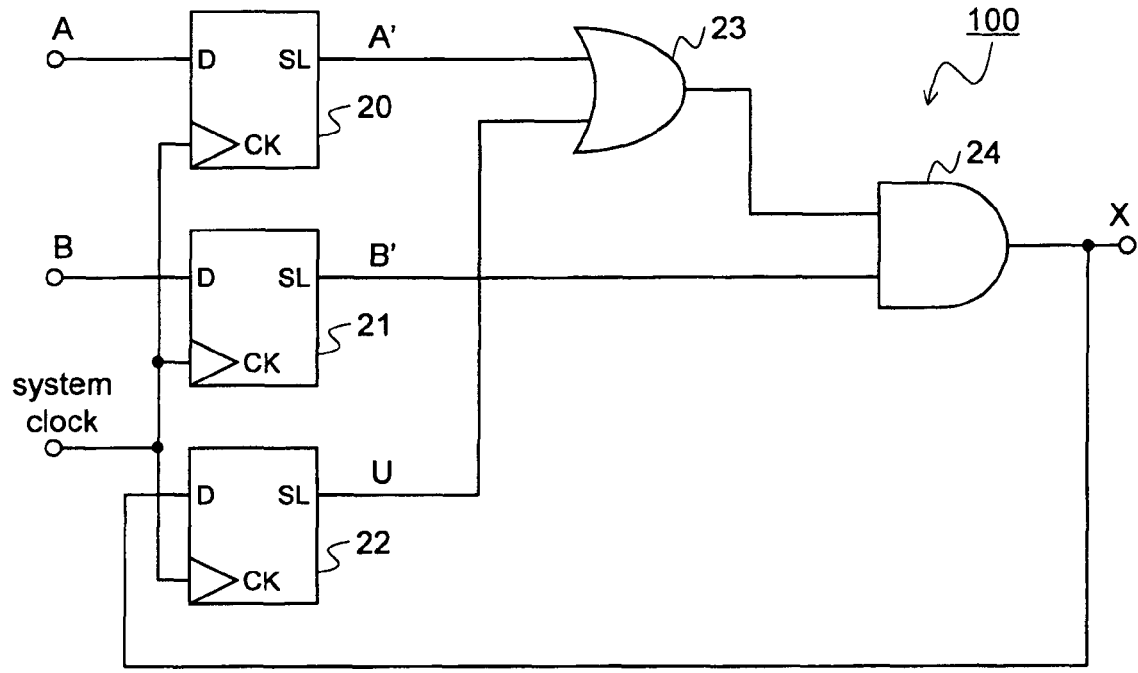

FIGS. 4 and 5 are diagrams illustrating a structure of an embodiment of the temperature sensor circuit according to the present invention. FIGS. 4 and 5 are combined together to illustrate a temperature sensor circuit 100 according to one embodiment of the present invention.

The temperature sensor circuit 100 illustrated in FIG. 4 includes the ring oscillator (hereinafter will be referred to as "ROSC") 1, a frequency-dividing circuit 5, a synchronizing circuit 6, a counter 7, a counted value holding latch 8, an established upper limit value holding latch 9, an established lower limit value holding latch 10, comparators 11 and 12, OR gates 13 and 14, shift registers 15 and 16, and majority circuits 17 and 18.

An oscillation output of the ROSC 1 is frequency-divided into predetermined cycles by the frequency-dividing circuit 5. Since one cycle of the ROSC 1 is short, a value is also small which is obtained by converting an effect of the substrate temperature appeared in one cycle into time. Even when the output of the ROSC 1 is frequency-divided, a ratio of the effect of the substrate temperature to one cycle of a waveform resulting from frequency-division does not change. However, by the frequency-division, a value obtained by converting the effect of the substrate temperature into time increases in proportion to a ratio of the frequency-division. Accordingly, changes in frequency caused by the effect of the substrate temperature can be detected accurately.

An output of the frequency-dividing circuit 5 is synchronized with a system clock by the synchronizing circuit 6. Thus, the output is synchronized with a clock counted by the counter 7. The system clock is a basic clock used in the whole of a semiconductor device 103 (see FIG. 8). An output of the synchronizing circuit 6 is fed as a synchronizing reset signal to the counter 7, fed as a clock CK to the counted value holding latch 8, and fed as the clock CK to the shift registers 15 and 16.

The counter 7 counts a predetermined clock during one cycle of the output of the frequency-dividing circuit 5. Specifically, every one cycle of the output of the synchronizing circuit 6, the counter 7 is a counting circuit which counts the system clock of the semiconductor device 103 (see FIG. 8) during the above one cycle, and then outputs a counted value. One cycle of the output of the frequency-dividing circuit 5 is made sufficiently longer than (several thousand times as long as, for example) one cycle of the system clock. The counter 7 is reset in synchronization with the synchronizing reset signal (with a rising edge of high-level of the signal, for example).

When the counted value exceeds (overflows) a maximum countable value, the counter 7 resets the counted value, starts to count again, and outputs an overflow signal OVFL (of high level). As described later, the signal OVFL is inputted to the OR gates 13 and 14. Accordingly, even when the counted value decreases to a small value by the overflow of the counter 7, a signal identical with a detection signal (of high level), which is described later, is inputted to the shift registers 15 and 16. That is, the signal OVFL is a pseudo detection signal which is generated when the counted value overflows. Thus, the substrate temperature can be detected accurately even when the counter 7 overflows.

The counted value counted by the counter 7 is inputted to the counted value holding latch 8, and held therein. In synchronization with the clock CK (or with its high-level rising edge), the counted value holding latch 8 accept and holds the counted value of the counter 7 at that point of time. The value (output) held by the counted value holding latch 8 is inputted to the comparators 11 and 12.

The comparator 11 is a comparing circuit which compares a count output of the counter 7 with the established upper limit value held by the established upper limit value holding latch 9, and outputs a first detection signal (of high level) when the count output is larger than the established upper limit value. The established upper limit value holding latch 9 is a first holding circuit which holds the established upper limit value corresponding to an upper limit value of the substrate temperature. Specifically, the comparator 11 compares an output of the counted value holding latch 8 with the established upper limit value. That is, the comparator 11 detects an upper limit of the substrate temperature. A detection output of the comparator 11 is inputted to the shift register 15 via the OR gate 13.

The established upper limit value is a signal to determine whether or not the substrate temperature is higher than its upper limit value. That is, the established upper limit value is a value (counted value) corresponding to the upper limit value of the substrate temperature, for example, 85° C. (see FIG. 7). The upper limit value of the substrate temperature is a temperature at which possibility of a malfunction of the semiconductor device 103 arises, or a temperature just before the above temperature. The upper limit value of the substrate temperature is determined depending on various conditions including a fabrication process and the like of the semiconductor device 103 (see FIG. 8). For this reason, before shipping the semiconductor device 103, a counted value counted by the counter 7 is measured in a state that the semiconductor device 103 is heated by a heater in such a manner that the substrate temperature reaches to 85° C. The counted value thus measured is preset in the counted value holding latch 8 (this holds true for the established lower limit value).

The shift register 15 includes a plurality of unit circuits (six unit circuits in this embodiment), and holds and shifts the first detection signal, which is outputted from the OR gate 13 connected to the comparator 11. The detection output inputted to the shift register 15 is shifted one bit at a time according to the clock CK. In the shift register 15, signals each of which are held by an odd number of (three or more, five in this embodiment) unit circuits of the shift register 15 are inputted to the majority circuit 17. The majority circuit 17 includes a known circuit, and makes a decision by adopting a majority of values held by the odd number of unit circuits of the shift register 15. When a majority of the first detection signal is at high level, the majority circuit 17 outputs the first detection signal as a final upper limit detection signal A (of high level). Then, it is possible to realize a stabilized operation of detecting the upper limit of the substrate temperature.

As can be seen from FIG. 4, a lower limit of the substrate temperature is detected in a manner similar to the above. Specifically, the comparator 12 compares an output of the counted value holding latch 8 (or the count output of the counter 7) with the established lower limit value held by the established lower limit value holding latch 10, and then outputs a second detection signal of high level when the count output is larger than the established lower limit value. The established lower limit value holding latch 10 is a second holding circuit which holds the established lower limit value corresponding to a lower limit value of the substrate temperature. A detection output of the comparator 12 is inputted to the shift register 16 via the OR gate 14. Signals each of which are held by an odd number of unit circuits of the shift register 16 are inputted to the majority circuit 18. When the majority of second detection signals inputted are at high level, the majority circuit 18 finally outputs a lower limit detection signal B (of high level).

The established lower limit value is a signal to determine whether or not the substrate temperature is higher than its lower limit value. That is, the established lower limit value is a counted value corresponding to the lower limit value of the substrate temperature (65° C. (see FIG. 7), for example). The lower limit value of the substrate temperature is lower than the upper limit value, and is a temperature at which there is no possibility of a malfunction when the semiconductor device 103 starts to operate again.

FIG. 5 illustrates a generation circuit generating an output signal X which stops an operation of a circuit based on the upper limit detection signal and lower limit detection signal. In FIG. 5, the upper limit detection A is inputted to a flip-flop (FF) 20, and the lower limit detection signal B is inputted to a FF 21. An output A' of the FF 20 is inputted to an AND gate 24 via an OR gate 23, and an output B' of the FF 21 is inputted to the AND gate 24. Thus, the AND gate 24 outputs the output signal X. The output signal X is feedback-inputted to a FF 22, and an output U of the FF 22 is inputted to the OR gate 23. A function of the output U will be described later.

The output signal X is an output of the temperature sensor circuit 100, and is a stop signal to the semiconductor device 103. When the output signal X is at low level (or "0"), the output signal X allow the semiconductor device 103 to operate (see FIG. 6). When the output signal X is at high level (or "1"), the output signal X causes the semiconductor device 103 to stop operating. Even during the stop, the temperature sensor circuit 100 itself continues detecting operation of the substrate temperature.

For stopping the semiconductor device 103, for example, an NOP (No Operation) command may be generated during a period in which the output signal X is at high level, and then the semiconductor device 103 may be stopped in fact based on the command. In this case, the temperature sensor circuit 100 may include an NOP command generating circuit (not illustrated). Further, for stopping the semiconductor device 103, a status of the semiconductor device 103 may be saved into a nonvolatile memory or the like (not illustrated), and, after that, the power may be shut down to stop the semiconductor device 103.

Figure 6:
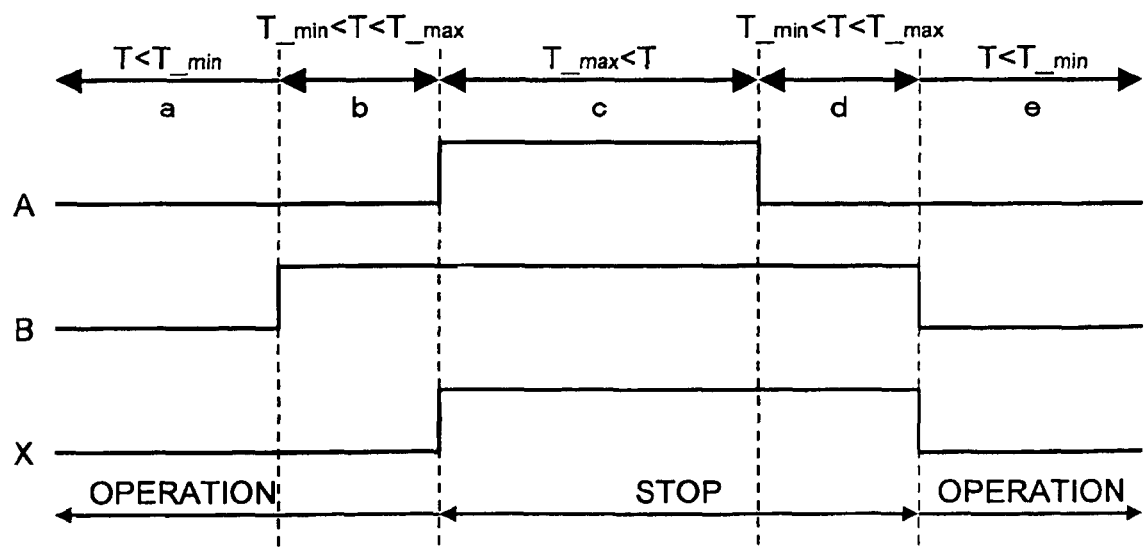
FIGS. 6 and 7 are diagrams explaining a temperature sensor circuit according to one embodiment of the present invention.
Figure 7:
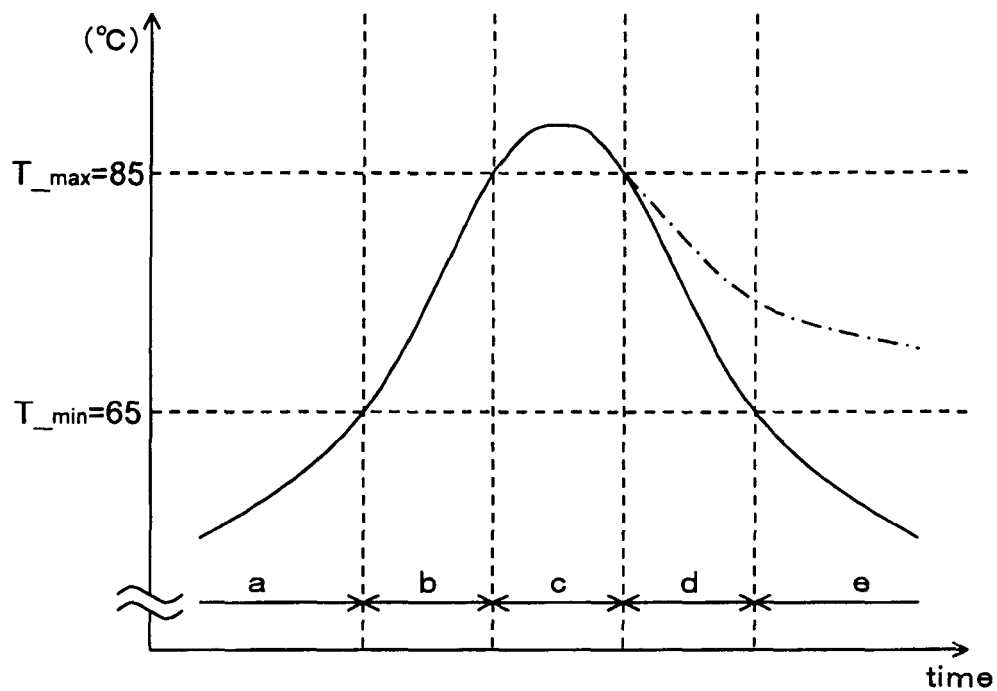

FIGS. 6 and 7 are diagrams explaining a temperature sensor circuit according to one embodiment of the present invention. FIG. 6 illustrates a relationship between transitions of the output signal of the circuit illustrated in FIGS. 4 and 5 and operating conditions of the semiconductor device 103. FIG. 7 illustrates changing of the substrate temperature according to an operating time of the semiconductor device 103. Regions or periods "a" to "e" illustrated in FIG. 6 correspond to those illustrated in FIG. 7. As illustrated in FIGS. 6 and 7, the substrate temperature T of the semiconductor device 103 belongs to the region "a" just after the semiconductor device 103 starts to operate. In the region "a", the substrate temperature T is lower than its lower limit value T_min (=65° C.), or, T<T_min. Accordingly, the upper limit detection signal A and the lower limit detection signal B are at low level. Accordingly, the output signal X is at low level, and hence, the semiconductor device 103 is allowed to operate.

As the semiconductor device 103 continues to operate, the substrate temperature T gradually rises, and reaches the region "b". In the region "b", the substrate temperature T is higher than its lower limit value T_min, and lower than its upper limit value T_max (=85° C.), or, T_min<T<T_max. Accordingly, the upper limit detection signal A is at low level, and the lower limit detection signal B is at high level. Accordingly, the output signal X is at low level, and hence, the semiconductor device 103 is allowed to operate.

As the semiconductor device 103 further continues to operate, the substrate temperature T further rises, and reaches the region "c". In the region "c", the substrate temperature T is higher than its upper limit value T_max (or, T_max<T). Accordingly, the upper limit detection signal A and the lower limit detection signal B are at high level. Accordingly, the generation circuit illustrated in FIG. 5 generates the output signal X of high level as the stop signal during a period in which the upper limit detection signal A is outputted. Based on the stop signal, the operation of the semiconductor device 103 is stopped.

When the semiconductor device 103 is stopped, the substrate temperature T gradually lowers, and reaches the region "d". The region "d" is in the same condition as the region "b". Accordingly, the upper limit detection signal A is at low level, and the lower limit detection signal B is at high level. However, the output U of the FF 22 is kept at high level. As a result, the generation circuit illustrated in FIG. 5 generates the output signal X of high level during a period in which the upper limit detection signal A is not outputted and the lower limit detection signal B is outputted, after the upper and lower limit detection signals A and B are outputted. Based on the signal X of high level, the operation of the semiconductor device 103 is stopped. Thus, it is possible to prevent the semiconductor device 103 from being stopped again resulted from that the substrate temperature exceeds the upper limit value immediately after the semiconductor device 103 restart to operate.

As the semiconductor device 103 further continues to stop, the substrate temperature T further lowers, and reaches the region "e". The region "e" is in the same condition as the region "a". Accordingly, the upper limit detection signal A and the lower limit detection signal B are at low level, and the output signal X is at low level. Thus, the semiconductor device 103 is allowed to operate.

Figure 8:
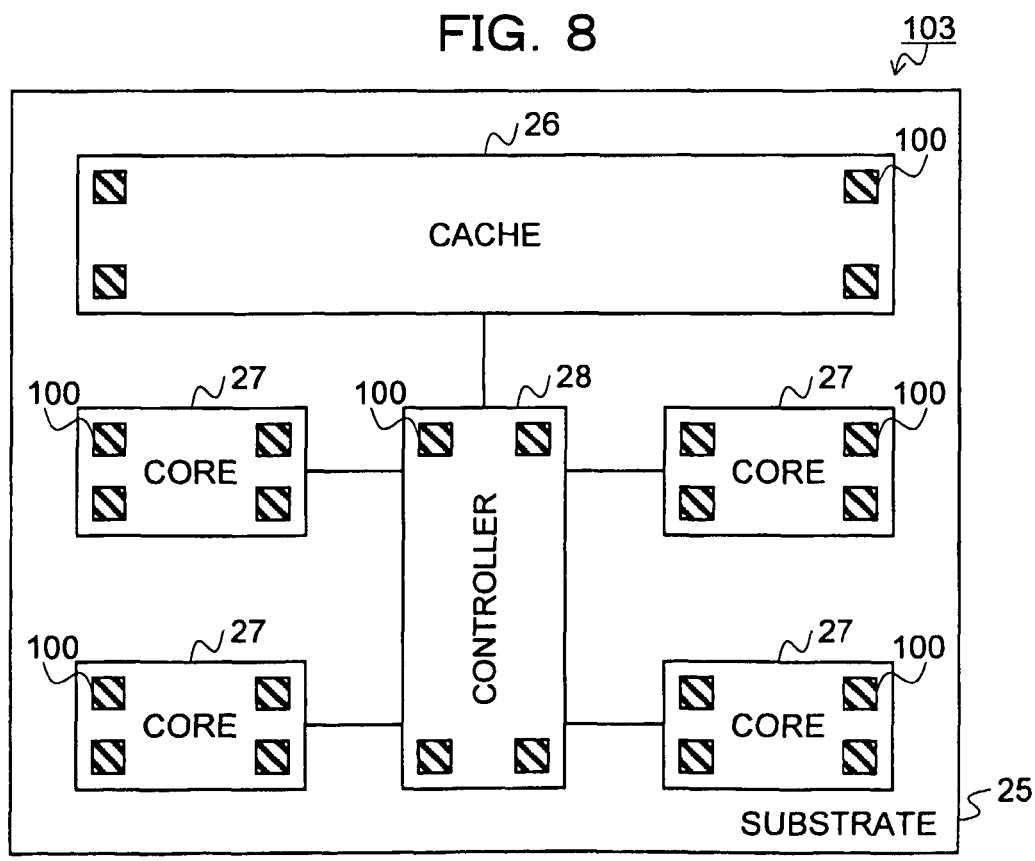
FIG. 8 is a diagram illustrating a structure of a semiconductor device provided with a temperature sensor circuit according to one embodiment of the present invention.

FIG. 8 is a diagram illustrating a structure of a semiconductor device, which is provided with the temperature sensor circuit, according to one embodiment of the present invention. For example, the semiconductor device 103 includes a plurality of circuit blocks 26 to 28 provided on a semiconductor substrate 25 made of single crystal silicon, and at least one temperature sensor circuit 100 provided for each of the plurality of circuit blocks 26 to 28. The plurality of circuit blocks 26 to 28 include, for example, a cache (memory) 26, a plurality of cores (core blocks) 27, and a controller 28. The plurality of cores 27 may have different circuit functions, or cores having the same function may be provided on the same substrate.

Since the semiconductor device 103 is a very large scale integrated circuit, the temperature (substrate temperature) of the semiconductor substrate (LSI chip) 25 forming the semiconductor device 103 differs depending on positions on the substrate 25. For this reason, the temperature sensor circuit 100 is provided for each of the circuit blocks 26 to 28. In the embodiment, each of the circuit blocks 26 to 28 is provided with four temperature sensor circuits 100, as indicated by sloped lines. Each location of temperature sensor circuits 100 is determined empirically.

Based on the output signals X from a certain temperature sensor circuits 100, one of the circuit blocks 26 to 28 is stopped to operate which has the certain temperature sensor circuit 100. For each temperature sensor circuit 100, it is possible to determine a corresponding circuit or a circuit to be stopped by the output signal X of the temperature sensor circuit 100 in the circuit blocks 26 to 28. Further, only a circuit which is effective to make the substrate temperature decrease based on the output signal X.

Further, output signals X of a plurality of temperature sensor circuits 100 may be inputted to a substrate temperature control unit (not illustrated) of the controller 28, for example. In this case, the substrate temperature control unit monitors the output signals X from the respective temperature sensor circuits 100 cyclically in a predetermined sequence, and controls the operation of the semiconductor device 103 based on the result of monitoring. For example, when the output signal X from a certain temperature sensor circuit 100 is at high level, a circuit block having the certain temperature sensor circuit 100 which outputted the output signal X is stopped to operate, while a rest of the circuit blocks 26 to 28 is allowed to continue operating. The operation of the whole semiconductor device 103 (the circuit blocks 26 to 28) may be stopped based on the above result of monitoring. Further, based on the above result of monitoring, a circuit block having the temperature sensor circuit 100 which outputted the output signal X may be stopped to operate together with a circuit block adjacent thereto. On the contrary, based on the above result of monitoring, only those circuits provided around a circuit block having the temperature sensor circuit 100 which outputted the output signal X may be stopped to operate.

Figure 9:
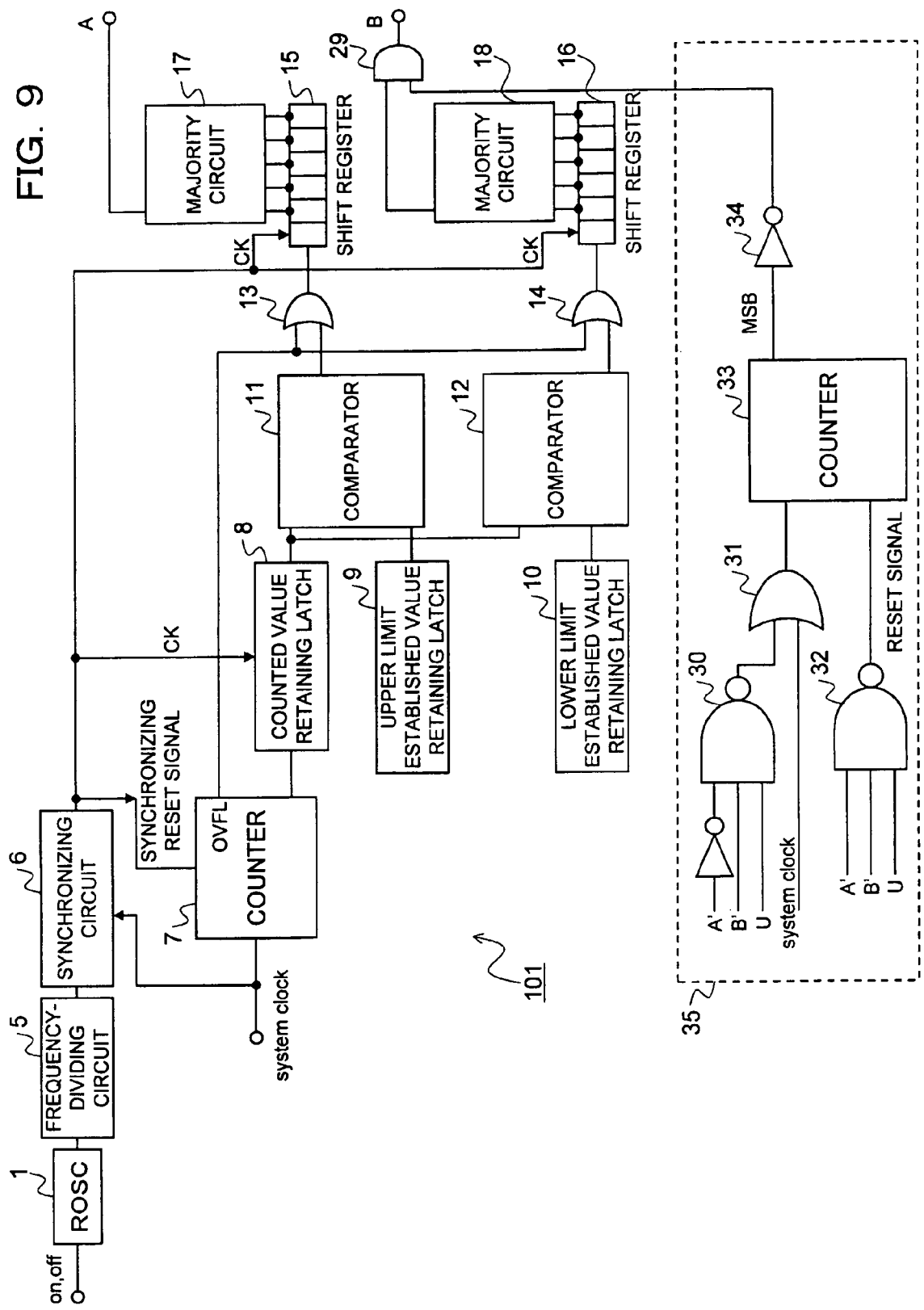
FIG. 9 is a diagram illustrating a structure of another embodiment of a temperature sensor circuit according to the present invention.

FIG. 9 is a diagram illustrating a structure of another embodiment of the temperature sensor circuit according to the present invention. A temperature sensor circuit 101 illustrated in FIG. 9 has a structure which is added a reset signal generating circuit 35 to the temperature sensor circuit 100 illustrated in FIGS. 4 and 5.

There is a case that the substrate temperature T of the semiconductor device 103 does not lower easily for some cause, as plotted by dashed dotted line in FIG. 7. That is, there is a case that the substrate temperature T remains within the region "d" for a long time, and does not reach the region "e". In this case, the semiconductor device 103 cannot restart to operate over a long time. The temperature sensor circuit illustrated in FIG. 9 is an embodiment in which the semiconductor device 103 restart to operate by the reset signal generating circuit 35 after spending a predetermined time when the substrate temperature T remains within the region "d".

As illustrated in FIG. 9, the reset signal generating circuit 35 includes a NAND gate 30, an OR gate 31, a NAND gate 32, a counter 33, and an inverter 34. The NAND gate 30 is inputted an inverted signal of the output A' of the FF 20 illustrated in FIG. 5 (or a signal inverted by an inverter connected to the NAND gate 30), the output B' of the FF 21, and the output U of the FF 22. An output of the NAND gate 30, together with the system clock, is inputted to the OR gate 31. An output of the OR gate 31 is inputted to the counter 33, and counted thereby. And, the NAND gate 32 is inputted the output A', output B', and output U. An output of the NAND gate 32 is inputted to the counter 33 as a reset signal thereto. The inverter 34 is connected to the output of the counter 33, and inverts the most significant bit MSB of the counter 33. This inverted signal is inputted to the AND gate 29 as an output of the reset signal generating circuit 35.

When the substrate temperature T changes from the region "c" to the region "d" in FIG. 6, the output A' changes from high level to low level, and the output B' and output U are kept at high level. Then, the output of the NAND gate 32 changes to high level, so that the counter 33 is reset, and starts to count. At the same time, the output of the NAND gate 30 changes to low level, so that the system clock is inputted to the counter 33. The counter 33 counts this input. Thus, after the first and second detection signals are outputted, a time period (or the time period of the region "d") is counted in which the second detection signal is outputted and the first detection signal is outputted. And, a reset signal is generated in response to spending a predetermined time period.

The counter 33 outputs only the most significant bit MSB of the counted value as the reset signal. Specifically, when the MSB of the counted value counted by the counter 33 reaches a value of "1" (or high level), the counter 33 outputs the MSB value (of high level), and an inverted signal of the output is then inputted to the AND gate 29. Accordingly, although the output of the majority circuit 18 is inputted to the AND gate 29, the lower limit detection signal B, which is the output of the AND gate 29, is forcibly made to low level, so that the output signal X outputted from the generation circuit illustrated in FIG. 5 is also made to low level. That is, the generation circuit illustrated in FIG. 5 does not generate the output signal X based on the reset signal, even during the period in which the first detection signal is not outputted and the second detection signal is outputted after the first and second detection signals are outputted. Thus, the semiconductor device 103 can restart to operate, although the substrate temperature T remains within the region "d".

Figure 10:
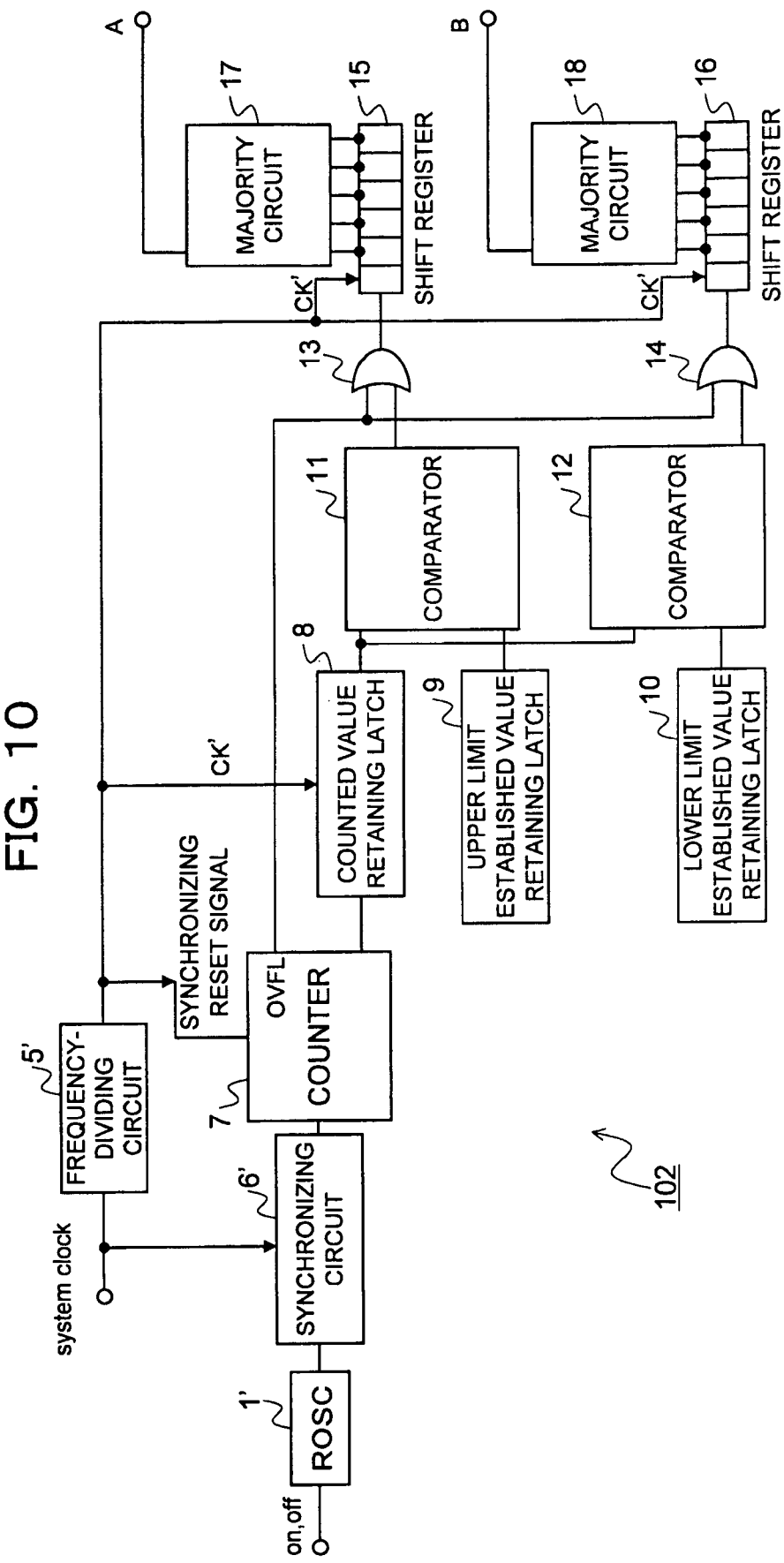
FIG. 10 is a diagram illustrating a structure of yet another embodiment of a temperature sensor circuit according to the present invention.

FIG. 10 is a diagram illustrating a structure of still another embodiment of the temperature sensor circuit according to the present invention. The temperature sensor circuit 102 illustrated FIG. 10 has a structure in which the system clock instead of the output of the ROSC 1 is frequency-divided by a frequency-dividing circuit 5', and the counter 7 counts an output of a ROSC 1' instead of the system clock, in the temperature sensor circuit 100 illustrated in FIGS. 4 and 5.

As can be seen from FIGS. 4 and 10, the frequency-dividing circuit 5, and 5' may simply frequency-divide one of the oscillation output of the ROSC 1 and the system clock. The counter 7 may be simply a circuit which counts the other of the oscillation output of the ROSC 1 and the system clock in one cycle of the output of the frequency-dividing circuit 5 or 5'. In the embodiment of FIG. 10, the frequency-dividing circuit 5' frequency-divides the system clock, and the counter 7 counts the oscillation output of the ROSC 1' in one cycle of the output of the frequency-dividing circuit 5'.

The ROSC 1', frequency-dividing circuit 5' and synchronizing circuit 6' which are illustrated in FIG. 10 has similar structures with the ROSC 1, frequency-dividing circuit 5 and synchronizing circuit 6 which are illustrated in FIG. 4, respectively. In the embodiment of FIG. 10, the system clock of the semiconductor device 103 is inputted to the frequency-dividing circuit 5', and frequency-divided thereby. An output of the frequency-dividing circuit 5' is fed as a synchronizing reset signal to the counter 7, fed as a clock CK' to the counted value holding latch 8, and fed as the clock CK' to the shift registers 15 and 16.

On the other hand, an output of the ROSC 1' is synchronized with the system clock by the synchronizing circuit 6'. Thus, the output of the ROSC 1' and the system clock are synchronized with a clock counted by the counter 7. An output of the synchronizing circuit 6' is fed to the counter 7. For every one cycle of the output of the frequency-dividing circuit 5', the counter 7 counts the output of the synchronizing circuit 6' (or the output of the ROSC 1') in the above one cycle, and outputs the counted value. Accordingly, the one cycle of the output of the frequency-dividing circuit 5' is made sufficiently longer than (several thousand times as long as, for example) one cycle of the ROSC 1'. Thus, the substrate temperature can be detected accurately.

As described above, the present embodiment makes it possible to measure the substrate temperature accurately by detecting the substrate temperature as the oscillation frequency of the ring oscillator. Accordingly, even when the amount of heat generated by a semiconductor device increases with growing scale of integration in the semiconductor device, a malfunction and the like of the semiconductor device can be prevented.

According to the present embodiment, in the temperature sensor circuit, by frequency-dividing one of the oscillation frequency of the ring oscillator proportional to the substrate temperature and the system clock, it is possible to lengthen the cycle of the oscillation frequency based on the frequency division ratio. Accordingly, the substrate temperature can be measured more accurately.

According to the present embodiment, in the semiconductor device provided with the temperature sensor circuit, it is possible to detect the substrate temperature as the oscillation frequency of the ring oscillator for each circuit block, thereby controlling the operation of the circuit block. Accordingly, even when the amount of heat generated by the semiconductor device increases with growing scale of integration in the semiconductor device, it is possible to measure the substrate temperature more accurately, and control the operations of its circuits, thereby preventing a malfunction and the like of the semiconductor device.

What is claimed is:

1. A ring oscillator for a temperature sensor, comprising:
an odd number of unit circuits connected in series, each of the unit circuits comprising an inverter, and one or more FETs each of which is a temperature sensor and uses a drain-source leakage current in a state that the FET is normally turned off.

2. The ring oscillator for the temperature sensor according to claim 1, wherein the one or more FETs each of which is the temperature sensor are inserted in series into the inverter.

3. The ring oscillator for the temperature sensor according to claim 2, wherein the one or more FETs each of which is the temperature sensor are provided closer to an output of the inverter than an FET which forms the inverter.

4. The ring oscillator for the temperature sensor according to claim 1, wherein the one or more FETs each of which is the temperature sensor are connected to an output of the inverter, and forms a transfer circuit.

5. The ring oscillator for the temperature sensor according to claim 1, wherein the one or more FETs each of which is the temperature sensor has a gate width larger than a gate width of an FET which forms the inverter.

6. A temperature sensor circuit comprising:
a ring oscillator having an odd number of unit circuits connected in series, each of the unit circuits comprising an inverter, and one or more FETs each of which is a temperature sensor and uses a drain-source leakage current in a state that the FET is normally turned off;
a frequency-dividing circuit frequency-dividing one of an oscillation output of the ring oscillator and a predetermined clock;
a counting circuit counting the other of the oscillation output of the ring oscillator and the predetermined clock in one cycle of an output of the frequency-dividing circuit;
a first holding circuit holding an established upper limit value corresponding to an upper limit value of a substrate temperature;
a comparing circuit comparing a count output of the counting circuit with the established upper limit value held by the first holding circuit, and outputting a first detection signal when the count output is larger than the established upper limit value; and
a generation circuit generating a stop signal which stops to operate a circuit based on the first detection signal.

7. The temperature sensor circuit according to claim 6, further comprising:
a second holding circuit holding an established lower limit value corresponding to a lower limit value of the substrate temperature which is smaller than the upper limit value,
wherein the comparing circuit compares the count output of the counting circuit with the established lower limit value held by the second holding circuit, and outputs a second detection signal when the count output is larger than the established lower limit value, and
wherein the generation circuit generates the stop signal during a period in which the first detection signal is outputted, and during a period in which the first detection signal is not outputted and the second detection signal is outputted after the first and second detection signals are outputted.

8. The temperature sensor circuit according to claim 7, further comprising:
a reset signal generating circuit counting a time period in which the first detection signal is not outputted and the second detection signal is outputted after the first and second detection signals are outputted, and generating a reset signal in response to spending a predetermined period,
wherein, based on the reset signal, the generation circuit do not generate the stop signal even during the period in which the first detection signal is not outputted and the second detection signal is outputted after the first and second detection signals are outputted.

9. The temperature sensor circuit according to claim 6, further comprising:
a shift register holding and shifting the first detection signal outputted by the comparing circuit; and
a majority circuit making a decision by adopting a majority of values held by an odd number of unit circuits of the shift register, and outputting the first detection signal when the majority of values are the first detection signal.

10. The temperature sensor circuit according to claim 6, wherein the counting circuit generates a pseudo first detection signal when the counted value overflows.

11. A ring oscillator comprising:
a plurality of unit circuits connected to each other in series, each of the unit circuits comprising an inverter circuit and a transistor connected to the inverter circuit, and being driven by a leakage current of the transistor.

12. The ring oscillator according to claim 11, wherein:
the transistor comprises a first FET being a non-conductive state normally; and
the ring oscillator is driven by a drain-source leakage current of the first FET.

13. The ring oscillator according to claim 12, wherein:
the inverter includes a second FET; and
the first FET has a gate width which is larger than a gate width of the second FET.

14. A temperature sensor circuit comprising:
a ring oscillator having a plurality of unit circuits connected in series, each of the plurality of unit circuits comprising an inverter and a first FET being normally turned off, the ring oscillator being driven by a drain-source leakage current of the first FET;

a frequency-dividing circuit frequency-dividing one of an oscillation output of the ring oscillator and a clock fed from outside;

a counting circuit counting the other of the oscillation output of the ring oscillator and the clock in one cycle of an output of the frequency-dividing circuit;

a first holding circuit holding an established upper limit value corresponding to an upper limit value of a substrate temperature; and a comparing circuit comparing a count output of the counting circuit with the established upper limit value held by the first holding circuit, and outputting a first detection signal when the count output is larger than the established upper limit value.

15. The temperature sensor circuit according to claim 14, further comprising:

a second holding circuit holding an established lower limit value corresponding to a lower limit value of the substrate temperature which is smaller than the upper limit value, wherein the comparing circuit compares the count output of the counting circuit with the established lower limit value held by the second holding circuit, and outputs a second detection signal when the count output is larger than the established lower limit value.

16. The temperature sensor circuit according to claim 14, further comprising:

a shift register holding a plurality of first detection signals outputted by the comparing circuit; and a majority circuit making a decision by adopting a majority of the first detection signals held by the shift register, and outputting the first detection signal adopted according to a result of the decision.

17. A temperature sensor circuit for detecting a temperature of a substrate, comprising:

a ring oscillator having a plurality of inverter circuits connected in series, and being driven by a leakage current of a plurality of transistors which form the plurality of inverter circuits; and a detecting unit detecting the temperature of the substrate based on an oscillation frequency of the ring oscillator.

18. A semiconductor device comprising:

a semiconductor substrate;

a circuit block provided on the semiconductor substrate; and a temperature sensor circuit provided in the circuit block, the temperature sensor circuit further comprising:

a ring oscillator having a plurality of unit circuits connected in series, each of the plurality of unit circuits comprising an inverter and a transistor being normally turned off, the ring oscillator being driven by a leakage current of the transistor;

a frequency-dividing circuit frequency-dividing one of an oscillation output of the ring oscillator and a predetermined clock;

a counting circuit counting the other of the oscillation output of the ring oscillator and the predetermined clock in one cycle of an output of the frequency-dividing circuit;

a first holding circuit holding an established upper limit value corresponding to an upper limit value of a substrate temperature;

a comparing circuit comparing a count output of the counting circuit with the established upper limit value held by the first holding circuit, and outputting a first detection signal when the count output is larger than the established upper limit value; and a generation circuit generating a stop signal which stops to operate the circuit block based on the first detection signal.

19. A semiconductor device comprising:

a semiconductor substrate;

a circuit block provided on the semiconductor substrate; and a temperature sensor circuit provided on the semiconductor substrate, the temperature sensor circuit further comprising:

a ring oscillator having an inverter and a transistor being normally turned off, and being driven by a leakage current of the transistor;

a counting circuit counting an oscillation output of the ring oscillator;

a first holding circuit holding an established upper limit value corresponding to a first temperature;

a first comparing circuit comparing a count output of the counting circuit with the established upper limit value, and outputting a first detection signal when the count output is larger than the established upper limit value;

a second holding circuit holding an established lower limit value corresponding to a second temperature which is lower than the first temperature;

a second comparing circuit comparing the count output with the established lower limit value, and outputting a second detection signal when the count output is larger than the established lower limit value; and a generation circuit generating a stop signal which stops to operate the circuit block based on the first detection signal.

20. The semiconductor device according to claim 19, wherein:

the temperature sensor circuit is provided in the circuit block; and the circuit block in which the temperature sensor is provided is stopped to operate based on the stop signal.

* * * * *